US009559019B2

(12) United States Patent
Adel et al.

(10) Patent No.: US 9,559,019 B2
(45) Date of Patent: Jan. 31, 2017

(54) METROLOGY THROUGH USE OF FEED FORWARD FEED SIDEWAYS AND MEASUREMENT CELL RE-USE

(71) Applicant: KLA-Tencor Corporation, Milpitas, CA (US)

(72) Inventors: Michael Adel, Zirchon Yaakov (IL); Leonid Poslavsky, Belmont, CA (US); John Fielden, Los Altos, CA (US); John Madsen, Sunnyvale, CA (US); Robert Peters, Allen, TX (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 0 days.

(21) Appl. No.: 14/588,055

(22) Filed: Dec. 31, 2014

(65) Prior Publication Data

US 2015/0112624 A1 Apr. 23, 2015

Related U.S. Application Data

(62) Division of application No. 12/502,112, filed on Jul. 13, 2009, now Pat. No. 8,930,156.

(60) Provisional application No. 61/082,451, filed on Jul. 21, 2008.

(51) Int. Cl.
*H01L 21/66* (2006.01)
(52) U.S. Cl.
CPC .............. *H01L 22/12* (2013.01); *H01L 22/20* (2013.01); *H01L 22/30* (2013.01); *H01L 2924/0002* (2013.01)

(58) Field of Classification Search
USPC ......................................... 702/81
See application file for complete search history.

(56) References Cited

U.S. PATENT DOCUMENTS

| 6,734,967 B1 | 5/2004 | Piwonka-Corle et al. |
| 7,408,642 B1 | 8/2008 | Dibiase |
| 7,440,105 B2 | 10/2008 | Adel et al. |

(Continued)

FOREIGN PATENT DOCUMENTS

| JP | 2002075815 A | 3/2002 |
| JP | 2005188944 A | 7/2005 |

(Continued)

OTHER PUBLICATIONS

M. Haffner, E-beam lithography of catalyst patterns for carbon nanotube growth on insulating substrates, Received Oct. 5, 2007, p. 768-773.*

(Continued)

Primary Examiner — Tung Lau
(74) Attorney, Agent, or Firm — Joshua D. Isenberg; JDI Patent

(57) ABSTRACT

Metrology may be implemented during semiconductor device fabrication by a) modeling a first measurement on a first test cell formed in a layer of a partially fabricated device; b) performing a second measurement on a second test cell in the layer; c) feeding information from the second measurement into the modeling of the first measurement; and after a lithography pattern has been formed on the layer including the first and second test cells, d) modeling a third and a fourth measurement on the first and second test cells respectively using information from a) and b) respectively.

7 Claims, 13 Drawing Sheets

(56) References Cited

U.S. PATENT DOCUMENTS

| | | |
|---|---|---|
| 8,930,156 B2 | 1/2015 | Adel et al. |
| 2003/0026471 A1 | 2/2003 | Adel et al. |
| 2004/0070772 A1 | 4/2004 | Shchegrov et al. |
| 2004/0101983 A1 | 5/2004 | Jones et al. |
| 2004/0267490 A1 | 12/2004 | Opsal et al. |
| 2008/0049226 A1 | 2/2008 | Mieher et al. |

FOREIGN PATENT DOCUMENTS

| | | | |
|---|---|---|---|
| JP | 2007266594 A | 10/2007 | |
| JP | 2007328289 A | 12/2007 | |
| JP | 2008053687 A | 3/2008 | |

OTHER PUBLICATIONS

European Patent Office, Extended European Search Report, dated Jan. 17, 2013, issued for European Application No. 09800821.2.
Israeli Office Action for IL Application No. 210061, dated Feb. 10, 2015.
Japanese Office action dispatch date Apr. 2, 2013,issued for Japanese patent Application No. 2011-520107.
Korean Office Action for KR Application No. 10-2015-7025787, dated Dec. 4, 2015.

* cited by examiner

| X1 | Y1 | X3 | Y4 |
|----|----|----|----|
| Y2 | X2 | Y3 | X4 |

FIG. 3A

| X1 | Y2 | X3 | Y4 |
|----|----|----|----|
| Y1 | X2 | Y3 | X4 |

FIG. 3B

METROLOGY THROUGH USE OF FEED FORWARD FEED SIDEWAYS AND MEASUREMENT CELL RE-USE

CLAIM OF PRIORITY

The present application is a divisional application of U.S. patent application Ser. No. 12/502,112, filed Jul. 13, 2009, entitled "IMPROVED METROLOGY THROUGH USE OF FEED FORWARD FEED SIDEWAYS AND MEASUREMENT CELL RE-USE" the entire contents of which are incorporated herein by reference. U.S. patent application Ser. No. 12/502,112 is a nonprovisional of U.S. Provisional Patent Application No. 61/082,451, filed Jul. 21, 2008, entitled "IMPROVED METROLOGY THROUGH USE OF FEED FORWARD FEED SIDEWAYS AND MEASUREMENT CELL RE-USE", the entire contents of which are incorporated herein by reference. The present application likewise claims the priority benefit of U.S. Provisional Patent Application No. 61/082,451, filed Jul. 21, 2008,

BACKGROUND OF INVENTION

As the components of semiconductor devices shrink to smaller and smaller sizes, now on the order of nanometers, the ability to improve metrology performance, productivity, and device correlation becomes ever so important. Old methods for determining film, critical dimensions (CD), and overlay metrology involved independent metrology of film, CD, and overlay on different targets and did not rely on the commonality of data and sampling between metrology paradigms. The disadvantages involved with these older methods included the need for occupying a large amount of scribe space; a slow move, acquire, and measurement (MAM) time; and limited modeling performance due to the need to float multiple parameters.

It is within this context that embodiments of the present invention arise.

BRIEF DESCRIPTION OF THE DRAWINGS

FIG. 3A is a plan view schematic diagram illustrating a layout for a four-cell metrology target in accordance with an embodiment of the present invention.

FIG. 3B is a plan view schematic diagram illustrating an alternative layout for a four-cell metrology target in accordance with an embodiment of the present invention.

DESCRIPTION OF THE SPECIFIC EMBODIMENTS

Embodiments of the present invention are directed towards improvement of film, critical dimension (CD), and overlay metrology performance, productivity, and device correlation through the implementation of a novel target design and use of feed forward scenarios. This invention aims to minimize setup time, metrology time, and minimize the reticle footprint cast on the semiconductor device.

The embodiments described herein have many possible advantages that will be generally described. First, the integrated metrology used in track could take measurements prior to any lithography, including metrology measurements for blanket films on top of prior structures. Also, by interpolating film thickness, other dispersive qualities of the film, and properties between film metrology sites, it is possible to sample fewer sites at deposition steps than we need to sample for overlay steps. By tracking wafers deposited and etched from the same chamber, one can use prior layer information from measurement of another wafer in the same lot and same chamber as our wafer if measurements do not exist for our wafer at the prior layer. Furthermore, embodiments of the present invention have the advantage of combining differential measurements and modeling with overlay offsets to enhance the parameters of interest or minimize the sensitivity to parameters not of interest.

Figure 1A:
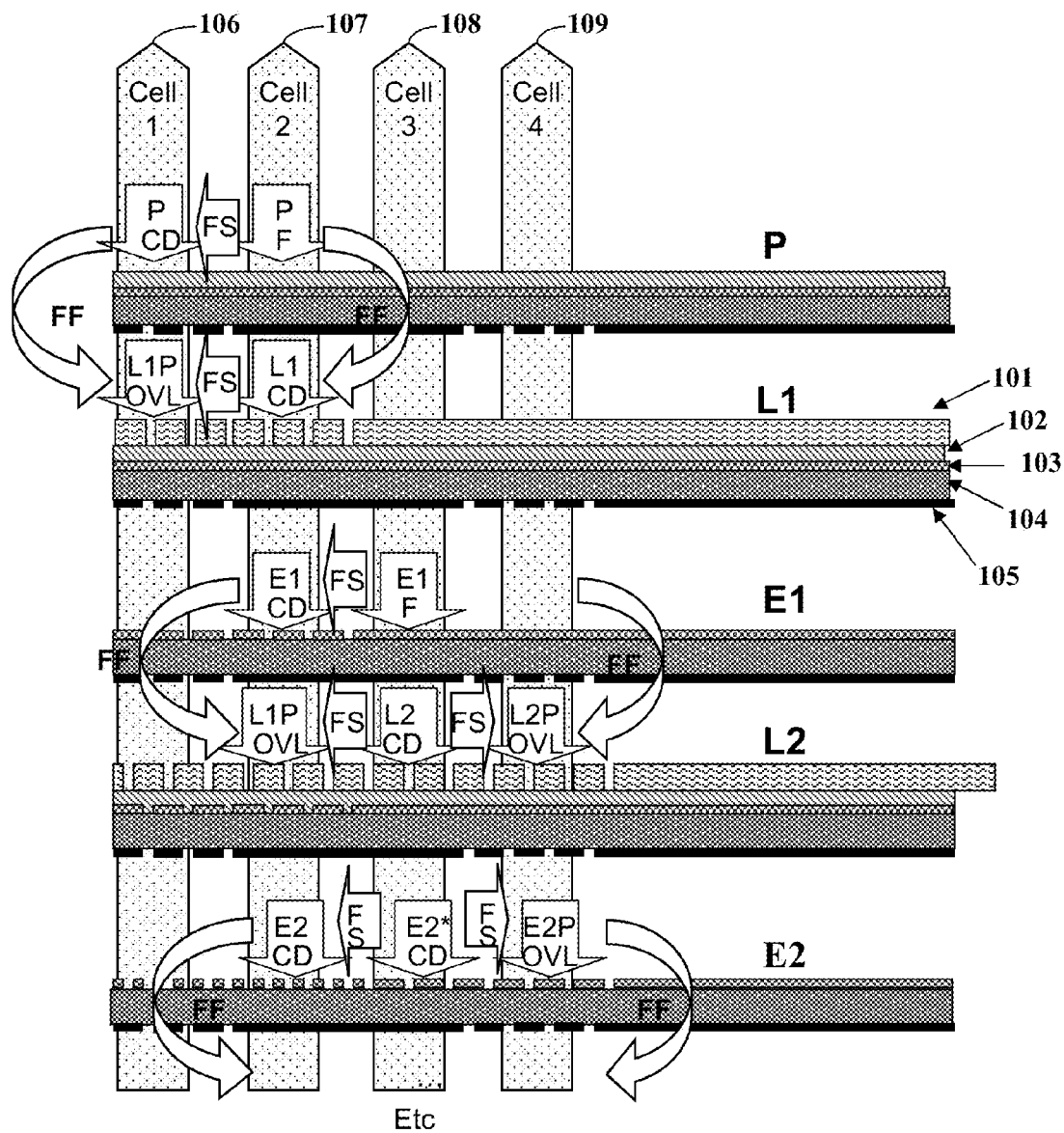
FIG. 1A is a sequence of schematic diagrams illustrating a prophetic example of metrology in accordance with an embodiment of the present invention.

FIG. 1A is a schematic diagram illustrating a sequence of cross-sectional figures that describe a method for metrology during semiconductor device fabrication according to an embodiment of the present invention. In FIG. 1A, the method for metrology used includes feed-forward, feed-sideways, and cell reuse technologies. The schematic diagram describes this method of metrology as it is used in a litho-etch-litho-etch double-patterning lithography setup. This method of metrology is not limited to use in this type of double-patterning lithography, as it can be implemented in correspondence with litho-litho-etch double-patterning lithography, single-patterning lithography, spacer patterning and can also be implemented to take metrology measurements under various other circumstances. FIG. 1A illustrates this method of feed-forward, feed-sideways, and cell reuse metrology using a 4-cell target layout, which involves 4-target cells aligned along the scribe line of the sample in question targeted at different areas, and scatterometry techniques to process metrology measurements in only one direction. This method of feed-forward, feed-sideways, and cell reuse metrology can be embodied with different enumerations of target cells depending on the type of metrology measurements necessary under the given circumstances. Furthermore, the scatterometry techniques can be implemented through spectroscopic and/or angle-resolved scatterometry, reflectometry, ellipsometry, etc.

According to the example illustrated in FIG. 1A, a patterned sample being measured may include up to 5 layers at each step of the sequence, including: a photoresist 101, a hard mask 102, a layer to be patterned 103, an insulation layer 104, and an existing pattern 105. Of course, under different circumstances, a greater or lesser number of layers may be present. However even if different numbers of layers are used, the feed-forward, feed-sideways, and cell reuse metrology method may still be able to implement automated recipe generation to provide feed-forward, feed-sideways, and cell reuse procedures. By way of example, a 4-target cell layout may be implemented using cell 1 106, cell 2 107, cell 3 108, and cell 4 109, each of which may be positioned to cover a different area along a scribe line of the sample in question. Initially, cell 1 may be used for a critical dimension measurement of a sample P with the existing pattern 105, insulation layer 104, the layer to be patterned 103, and a hard mask 102. Cell 2 107 may be used for measuring the film metrology of the sample P. Information from the film metrology measurement obtained using cell 2 may then be fed sideways to the measurement performed on cell 1 106 as indicated by the left-pointing arrow labeled FS. These film metrology measurements may include the film thickness, the film refraction dispersion qualities, or the film dielectric dispersion qualities. The measurement tool or process used for cell 1 106 may use this information to model the critical dimension (CD) metrology of the sample P. By way of example, the critical dimension measurement obtained with cell 1 may be in the form of line-edge roughness (LER), line-width roughness (LWR), sidewall angle, line width (top, middle, or bottom), corner rounding, or size of footer, which is a measurement of an extension of the bottom of the line.

After these two measurements are taken, a first lithographic step of a double-patterned lithography setup may be completed in which photoresist 101 is layered on top of the hard mask 102 and developed. The lithographic process produces a new sample L1 in a first subsequently formed layer, which includes the developed photoresist 101, which is then measured. In this example, cell 2 107 and cell 1 106 are both reused to measure this sample. The film metrology measured by cell 2 107 from sample P, may be fed forward to the measurement of cell 2 107, as indicated by the curved arrows labeled FF. Cell 2 107 may then be used for measurements targeting sample L1, and this cell is then used to model the critical dimension (CD) metrology of the sample L1. At this point, the CD of cell 2 107 from sample L1 may be fed sideways to the measurement process for cell 1 106, which is now targeting sample L1. Simultaneously, the CD of cell 1 106 taken from sample P may be fed forward to the measurement of cell 1 106, which is now targeting sample L1. In feeding forward the CD of cell 1 106 taken from sample P, one may feed forward a starting estimate of the CD to be further modeled, instead of the exact CD that was taken by cell 1 106 from sample P. Cell 1 106, targeting sample L1, may use this information to calculate the overlay between the sample after the first lithographic step L1 and that of the initial sample P.

After the measurements are taken for this first lithographic step, the sample may then be etched for the first time. This newly etched sample E1 consists of an incompletely patterned layer 103, the insulation layer 104, and the existing pattern 105. Cell 3 108, is now used for measurement of film metrology of this sample E1. This information may be fed sideways to a measurement of cell 2 107, which is now targeting sample E1, and the CD metrology of sample E1 is modeled.

After completing the first etch of the sample, a second lithographic step may be completed producing a new sample L2 in a second subsequently formed layer. This new sample L2 consists of our patterned sample after completion of the first etch with the addition of a hard mask 102 and another layer of developed photoresist 101. Cell 2 107 and cell 3 108 may be reused to take metrology measurements of the sample L2. The film metrology taken by cell 3 108 from sample E1, may be fed forward to the measurement of cell 3, which is now targeting sample L2. The measurement of Cell 3 108 may use this information to model the CD metrology of sample L2. The CD metrology modeled by cell 2 107 from sample E1, may be fed forward to the measurement of cell 2 107, which is now targeting sample L2. In feeding forward the CD of cell 2 106 taken from sample E1, one may feed forward a starting estimate of the CD to be further modeled instead of the exact CD that was taken by cell 2 107 from sample E1. Simultaneously or subsequently, the CD metrology modeled by cell 3 107 from sample L2 may be fed sideways to the measurement of cell 2 107, which is targeting sample L2. The measurement of cell 2 107 may use this information to calculate the overlay between sample L1 and sample P. Similarly, the CD modeled by cell 3 108 from sample L2 may be fed sideways to a measurement of cell 4 109, which may use this information to calculate the overlay between sample L2 and our initial sample P.

The last step to completing a litho-etch-litho-etch doublepatterning setup is a second etch step. The resulting sample E2 includes the patterned layer 103, the insulating layer 104 and the existing pattern 105. Cell 2 107, Cell 3 108, and Cell 4 109 are reused to take metrology measurements for this sample E2. Cell 3 108 is used to take measurements and model the CD of its targeted area on sample E2. This information is then fed sideways to measurements of both cell 2 107 and cell 4 109. The measurement of cell 2 107 may use this information to model the CD of its targeted area on sample E2. The measurement of cell 4 109 may use this information to calculate the overlay between sample E2 and the initial sample P.

Figure 1B:
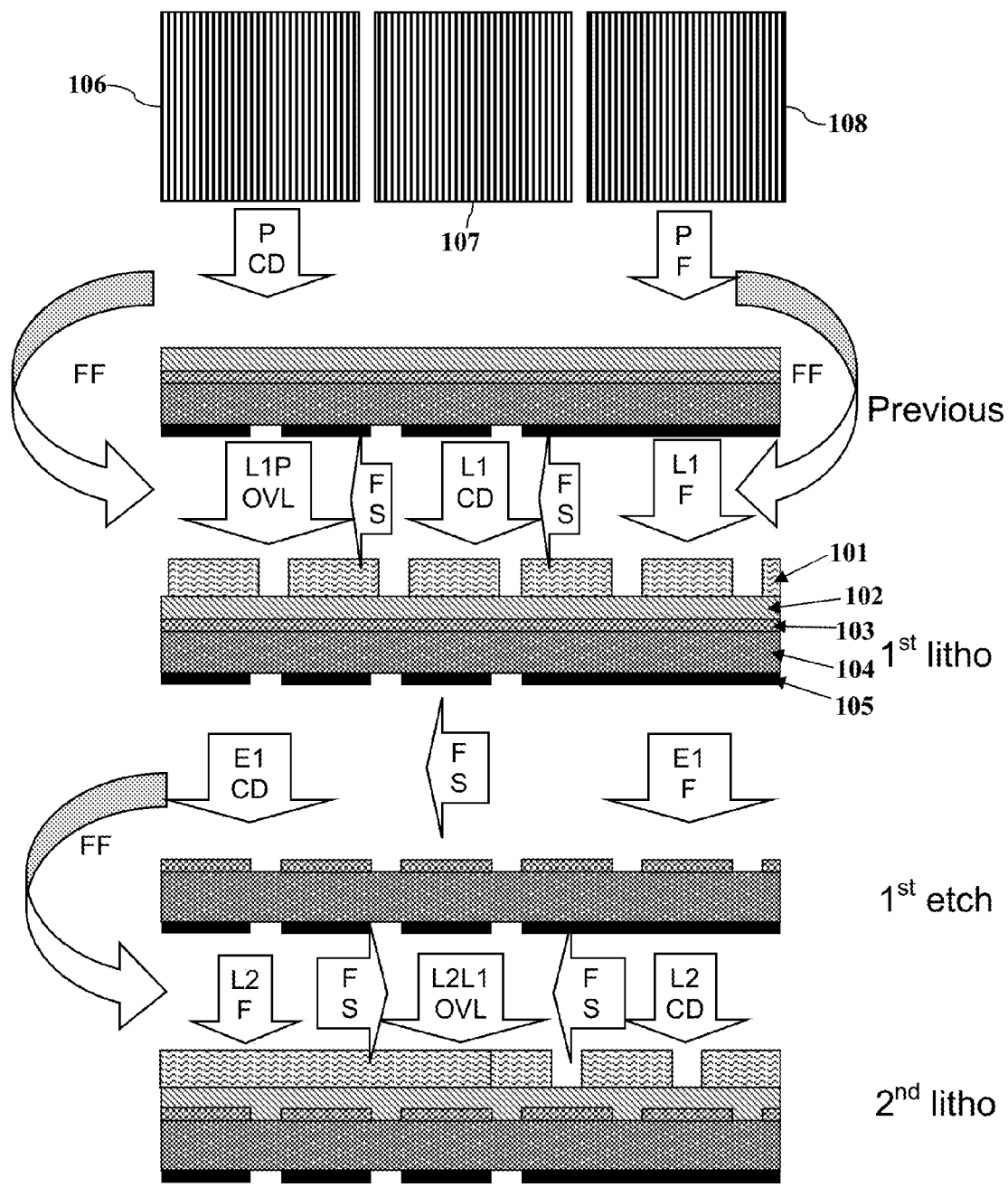
FIG. 1B is a sequence of schematic diagrams illustrating a prophetic example of metrology in accordance with an alternative embodiment of the present invention.

A number of variations on the process depicted in FIG. 1A are within the scope embodiments of the present invention. By way of example, and not by way of limitation, FIG. 1B illustrates a prophetic example of a method for metrology during semiconductor device fabrication according to an alternative embodiment of the present invention. This embodiment utilizes a three-cell target layout. It is noted that by removing one cell the feed forward to the L2 overlay from the previous overlay measurement may be disabled. However, the footprint required for the target used in the method depicted in FIG. 1B is substantially less than that required for the target used in the method of FIG. 1A. This may be a practical tradeoff in many cases, since L1 to P is still measured and the crucial (i.e., tightest tolerance) is between L2 and L1 in this example. The advantage of the 3-cell approach is that it reduces the overall footprint of the target and enables 4 use cases, focus/dose for litho 1 and litho 2, as well as critical dimension and overlay from litho 1 to previous and litho 2 to litho 1.

According to the example illustrated in FIG. 1B, a patterned sample being fabricated and measured may utilize the 5 layers described above, e.g., a photoresist 101, a hard mask 102, a layer to be patterned 103, an insulation layer 104, and an existing pattern 105. Under different circumstances, a greater or lesser number of layers may be present. By way of example, a 3-target cell layout may be implemented using cell 1 106, cell 2 107, and cell 3 108, each of which may be positioned to cover a different area along a scribe line of the sample in question. Initially, cell 1 106 may be used for a critical dimension (CD) measurement of a sample from a previous process with the existing pattern 105, insulation layer 104, the layer to be patterned 103, and a hard mask 102. Cell 3 108 may be used to measure focus and dose for the previous process. After the CD and focus/dose measurements are taken, a first lithographic step of a may be completed in which photoresist 101 is layered on top of the hard mask 102 and developed. The lithographic process produces a first lithography layer L1 formed by developing photoresist 101. The first lithography layer L1 may then be measured using all three cells 106, 107, 108. In this example, cell 1 106 is reused to measure overlay (OVL) between the previous layer and L1, cell 2 107 is for a critical dimension (CD) measurement of the first lithography layer L1, and cell 3 108 is reused for a focus/dose measurement of the first lithography layer L1.

In this example, the overlay measurement between the first lithography layer L1 and previous layer P may utilize information fed forward from the CD measurement on previous layer P with cell 1 106 and may also utilize information fed sideways from the CD measurement on L1 with cell 2 107. The CD measurement on the first lithography layer L1 done with cell 2 107 may also utilize information fed sideways from the focus/dose measurement done on layer L1 with cell 3 108. The focus/dose measurement done on lithography layer L1 with cell 3 108 may utilize information fed forward from the focus/dose measurement done on previous layer P using cell 108.

The layer 103 is patterned by an etch process that etches the layer 103 and the hardmask layer 102 through openings in the photoresist 101. The resulting etched pattern layer E1 may then be measured using cell 1 106 and cell 3 108. Specifically, cell 3 108 may be reused for a focus/dose measurement of etch pattern layer E1 and cell 1 106 may be reused for a CD measurement of etched pattern layer E1. Information from the focus dose measurement done with cell 3 108 may be fed sideways for use by the CD measurement done with cell 1 106. After completing the etch and measurement of the etched pattern layer E1, a second lithographic step may be completed producing a second lithography layer L2 formed by forming another hard mask and photoresist layer on the etched pattern layer E1 and developing the photoresist layer.

Metrology may be performed on the second lithography layer L2 by reusing cell 1 106, cell 2 107, and cell 3 108. Cell 1 106 may be reused for a focus/dose measurement, cell 2 107 may be reused for an overlay measurement between the first lithography layer L1 and the second lithography layer L2, and cell 3 108 may be reused for a CD measurement on the second lithography layer L2. The focus/dose measurement with cell 1 106 may also use information fed forward from the CD measurement on pattern layer E1 with cell 1 106. The overlay measurement between the first lithography layer L1 and the second lithography layer L2 with cell 2 107 may use information fed sideways from the L1-L2 overlay measurement with cell 1 106 and information fed sideways from the L2 CD measurement with cell 3 108.

Figure 1C:
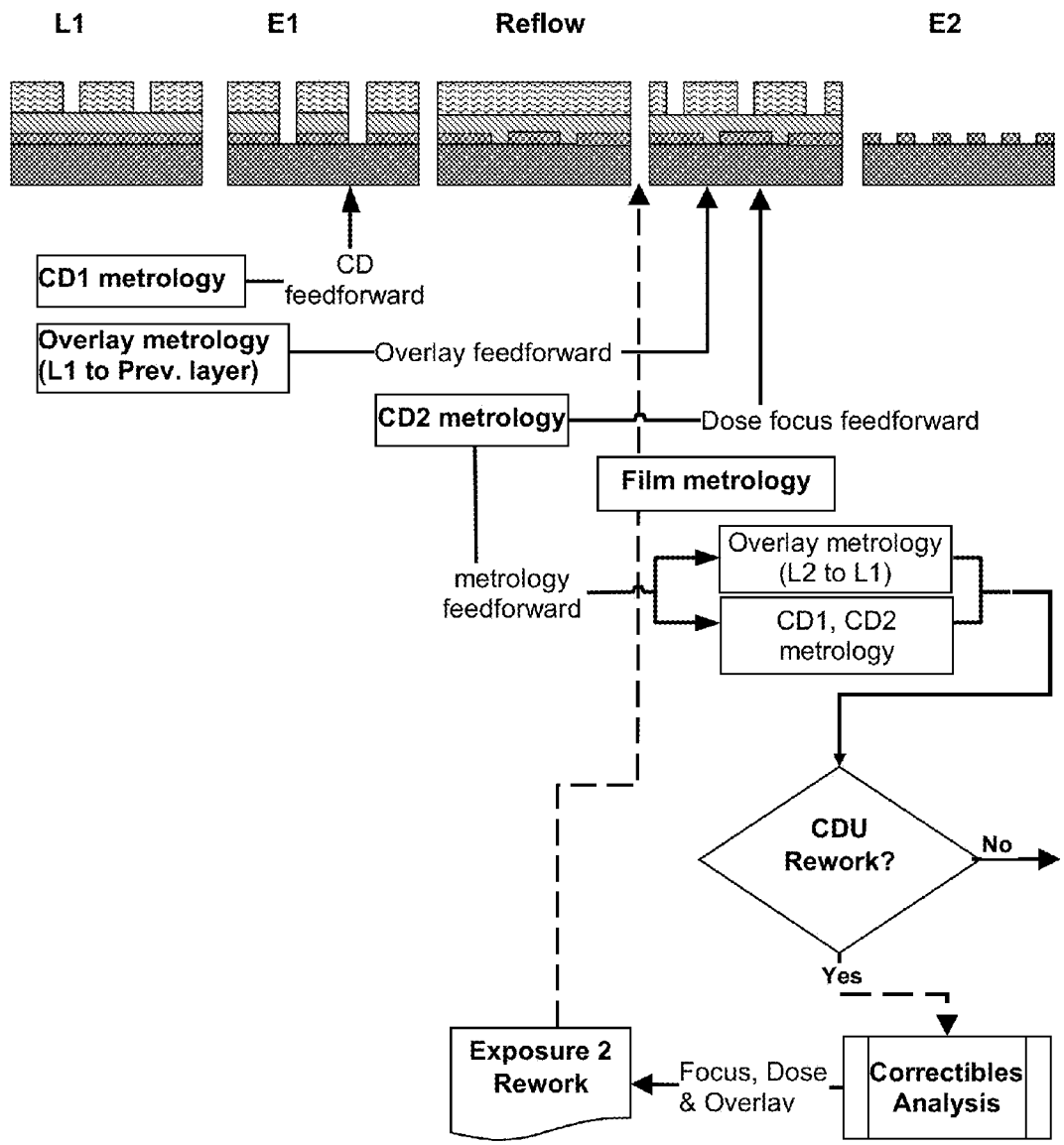
FIG. 1C is an information flow diagram illustrating a prophetic example of metrology in accordance with another alternative embodiment of the present invention.

According to an alternative embodiment metrology information fed forward and fed sideways may be used to provide adaptive information flow for DPL process control. FIG. 1C illustrates a prophetic example of how this may be implemented. Critical dimension metrology on a first lithographic layer L1 may be fed forward to be used in modeling metrology performed on an etched pattern layer E1. Film metrology may be performed after reflow of a hardmask layer and formation of a second lithography layer L2. Overlay metrology between the first lithographic layer L1 and a previous layer may be fed forward to be used in modeling metrology performed on the second lithographic layer L2. Critical dimension metrology (CD2) performed on the second lithographic layer L2 may be fed forward to model dose focus metrology performed on L2. Information from the CD1 and CD2 metrologies may be fed forward to be used in modeling overlay metrology between L2 and L1. The result of this overlay measurement (or modeling) and the CD1, CD2 metrologies may be analyzed to determine if any CDU rework is needed on the second lithographic layer L2. If rework is not required, the process may proceed to a subsequent etch that forms a second etch pattern E2. Otherwise, correctables analysis may be performed and focus, dose and overlay information from the analysis may be used to adjust the rework. The rework, may involve removing the second lithographic layer L2 and reforming and re-patterning it. Film metrology and CD2 may be repeated for the re-worked second lithographic layer L2.

Figure 1D:
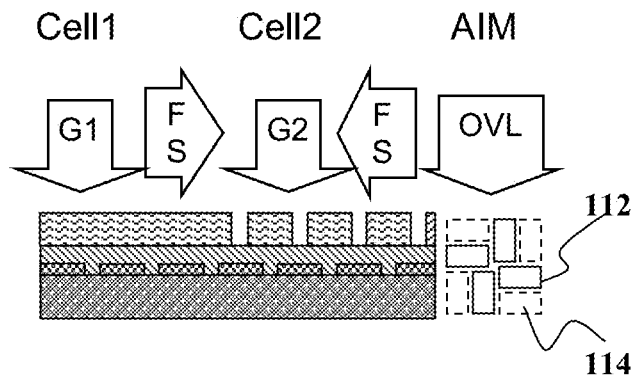
FIG. 1D is a sequence of schematic diagrams illustrating a prophetic example of metrology in accordance with another alternative embodiment of the present invention.

According to another alternative embodiment, OVL information may be fed forward or sideways from an imaging target as shown in FIG. 1D. This may have the advantage that overlay data from an imaging sensor can often be extracted from substantially smaller targets at a higher measurement rate. In the Example depicted in FIG. 1D, grating targets are formed in two cells (Cell 1 and Cell 2) and an imaging target is formed in a third cell (Cell 3). In the example depicted In FIG. 1D, information from grating measurements from Cell 1 and overlay measurement from Cell 3 is fed sideways to model a grating measurement made with Cell 2.

By way of example, the imaging target may include a first structure 112 formed in one layer and a second structure 114 formed in a different layer. The structures 112, 114 may be periodic (e.g., grating) structures. Such grating style targets (sometimes referred to as "AIM" marks) can be denser and more robust, than "box" or ring-type marks conventionally used for overlay measurement. This allows for collection of more process information, as well as target structures that can withstand the rigors of chemical mechanical polishing (CMP). The use of such marks is described, e.g., in commonly assigned U.S. Pat. Nos. 6,023,338, 6,921,916 and 6,985,618, all three of which are incorporated herein by reference for all purposes. Additional examples of such targets are described, e.g., in U.S. Pat. No. 7,408,642.

Figure 2A:
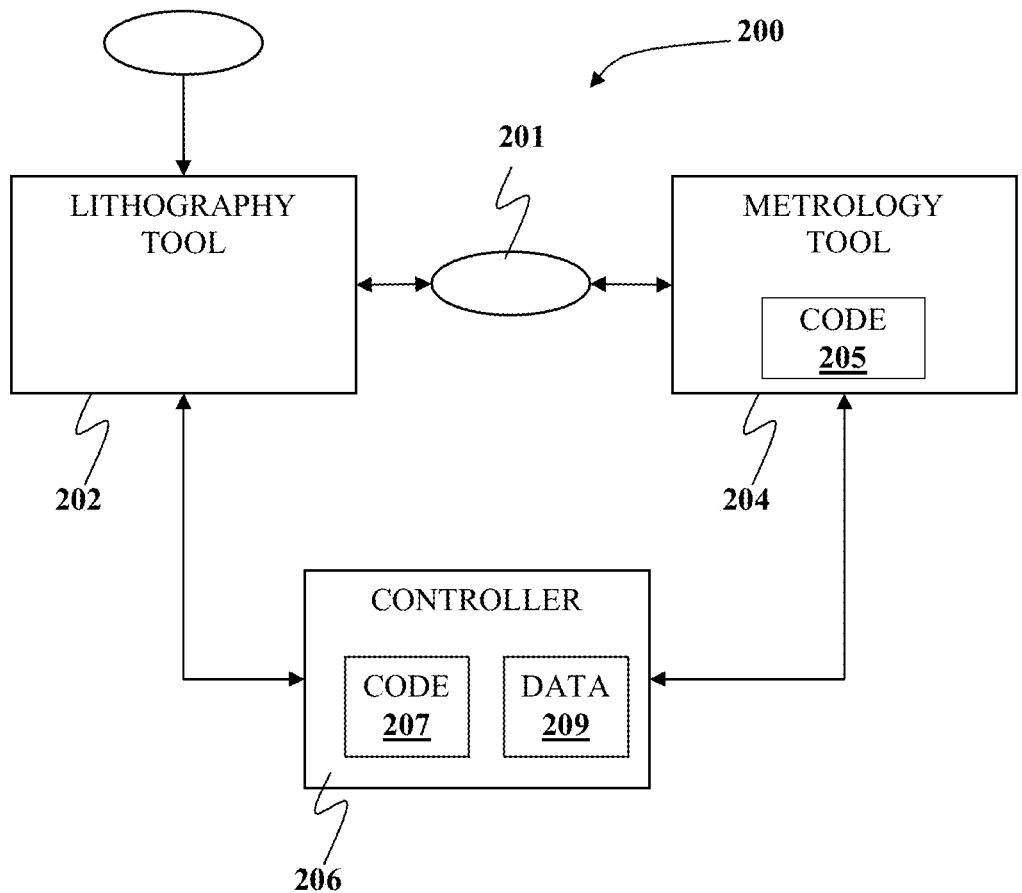
FIG. 2A is schematic diagram illustrating a prophetic example of a metrology apparatus in accordance with an embodiment of the present invention.

According to an embodiment of the present invention, an apparatus for metrology during semiconductor device fabrication may be configured to implement measurement processes of the types described above. For example, as shown in FIG. 2A, a semiconductor fabrication system 200 may comprise a lithography tool 202, a metrology tool 204 and a controller 206. The metrology tool may include a computer processor and memory configured with coded instructions 205 that control the metrology tool and process information obtained from measurements taken with the metrology tool 204. The controller 206 may include a general-purpose computer programmed with instructions 207 to control the operation of lithography tool 202 and metrology tool 204. In addition, the controller 206 may include a memory that stores data 209, which may include the results of measurements obtained by the metrology tool.

The lithography tool 202 performs lithographic processes on substrates 201. The metrology tool 204 is configured to perform one or more types of metrology measurement on a layer of material or a pattern formed in a layer of material on the substrates 201. Upon execution, the coded instructions 205 may cause the metrology tool 204 to:

a) model a first measurement on a first test cell formed in a layer of a partially fabricated device;
b) perform a second measurement on a second test cell in the layer;
c) feed information from the second measurement into the modeling of the first measurement; and
d) after a lithography pattern has been formed on the layer including the first and second test cells, model a third and a fourth measurement on the first and second test cells respectively using information from a) and b) respectively. The instructions 205 may also cause to metrology tool 204 to implement other operations.

The instructions 205 implemented by the metrology tool 204 may operate in conjunction with the instructions 207 implemented by the controller 206 to enable the feed forward and sideways use cases described above. For example, in the case of feed sideways, metrology data from two adjacent cells may be acquired sequentially in close temporal proximity. A number of options may be envisaged for the data handling. Firstly, the metrology data from the first cell (e.g. cell 1 106) may be kept in memory of the controller 206 (or the metrology tool 204) for immediate use in calculation of the subsequent structural parameters after measurement of the second cell (e.g., cell 2 107). Secondly, the metrology data from the first cell can be stored in a "wafer level" database or model and used subsequently in calculation of structural parameters after measurement of the second cell.

In the case of feed forward, the metrology data from one or more cells may be collected from some or all sites of a given wafer and then kept in a database for future retrieval for use as input in calculation of metrology parameters from the same or different cell after processing. In one embodiment, the database may be kept resident on the metrology tool 204. In another embodiment, the database may be kept by an analysis database, such as Archer Analyzer available for KLA-Tencor or San Jose, Calif. In a third embodiment the database may be kept in the controller 206, e.g., a fab host computer and data may be provided as requested by the metrology tool 204.

Figure 2B:
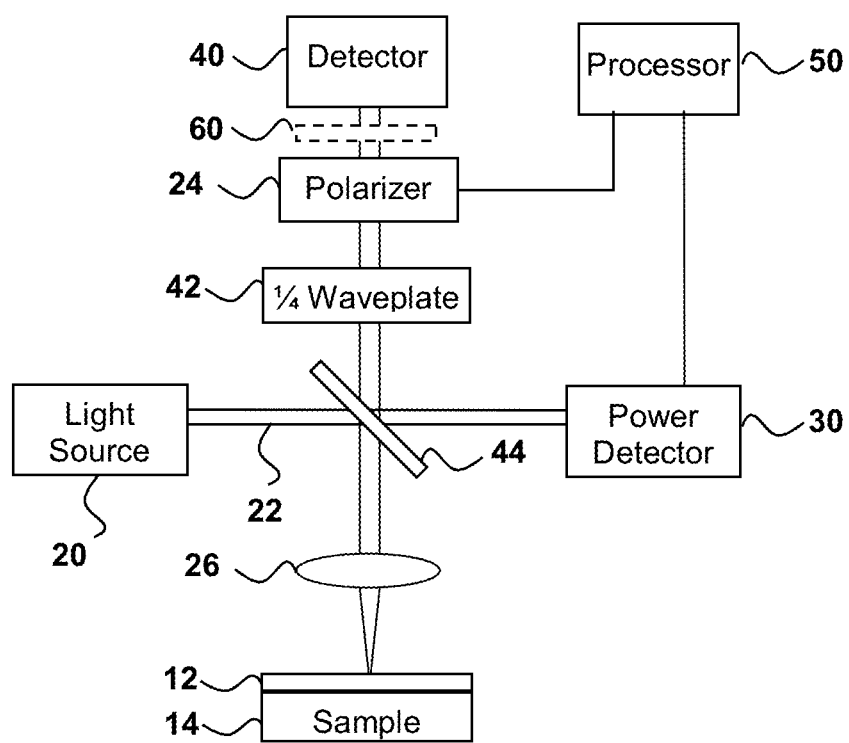
FIG. 2B is a schematic diagram illustrating a prophetic example of a metrology tool that may be used to make measurements during the course of metrology in accordance with an embodiment of the present invention.

The metrology tool may be configured to perform scatterometry, overlay and CD. Such measurements may be performed with any suitable technique. FIG. 2B illustrates an example of a metrology tool that may be used to perform such measurements. FIG. 2B illustrates an angle resolved reflectometer 10 that can be used to perform scatterometry measurements on the target structures at the surface of a sample 14, such as thin film layers 12 and/or structural features such as critical dimensions. The reflectometer 10 may include a light source 20 for generating a probe beam 22 of radiation. One suitable light source is a solid state laser diode which emits a linearly polarized beam having a stable, known and relatively narrow bandwidth. The probe beam 22 may be turned towards a sample 14 with a 50/50 beam splitter 44. The probe beam 22 may be focused onto the surface of the sample 14 with a lens 26. A fraction of the probe beam power also passes through the beam splitter 44 and falls on an incident power detector 30. In the reflectometer 10, waveplate 42 is optional. Polarizer 24 could be before detector 40, as shown, or after light source 20, or both. The light source 20 could be monochromatic or polychromatic. The output of the detector 40 is supplied to the processor 50 for evaluation. A full description of the angle resolved reflectometer 10 may be found in U.S. Pat. No. 6,995,842, which is incorporated herein by reference in its entirety.

If it is desired to extend this concept to measure multiple wavelengths, the laser light source 20 could be a white light source that would generate a polychromatic probe beam. A wavelength selective filter 60 (shown in phantom in FIG. 2B) may be placed somewhere in the light path between the light source 20 and the detector 40. The filter 60 could take the form of simple band pass (color) filters which are selectively moved into the path of the beam. Alternatively, a monochromater may be used to sequentially select narrow wavelength regions. Of course a tunable laser or multiple lasers with different wavelengths may also be used.

A more detailed description of a spectroscopic ellipsometer/reflectometer apparatus which could be used as the metrology tool 204 to make the scatterometry measurements in conjunction with embodiments of the present invention is shown in FIG. 2 of U.S. Pat. No. 6,734,967, which is incorporated herein by reference in its entirety.

According to an embodiment of the present invention a semiconductor device may incorporate a test structure comprising two or more cells. Each cell includes a plurality of test patterns formed in a substrate or a layer of material formed thereon. For at least one lithography step at least two cells are patterned with substantially the same test pattern. For at least one other lithography step only one cell is patterned and the other is left unpatterned. The patterns in each cell and/or the differences in the patterns between cells may be configured to facilitate feed forward or feed sideways of film, CD or other metrology information. In addition, the patterns in each cell and/or the differences in the patterns between cells may be configured or to reduce the number of fitted parameters in a metrology measurement.

In some embodiments it may be advantageous to layout the patterns in the cells in such a way as to minimize cross talk between adjacent cells. For example, because samples can be multi-dimensional, metrology measurements often must be taken in both the x-direction and the y-direction in order to complete this feed-forward, feed-sideways, and cell reuse method of metrology. By way of example, a test structure may comprise at least four cells, at least two of which have patterns that are substantially oriented in one direction and at least two others of which have similar patterns that are oriented in a direction substantially perpendicular to the first direction.

Figure 3A:
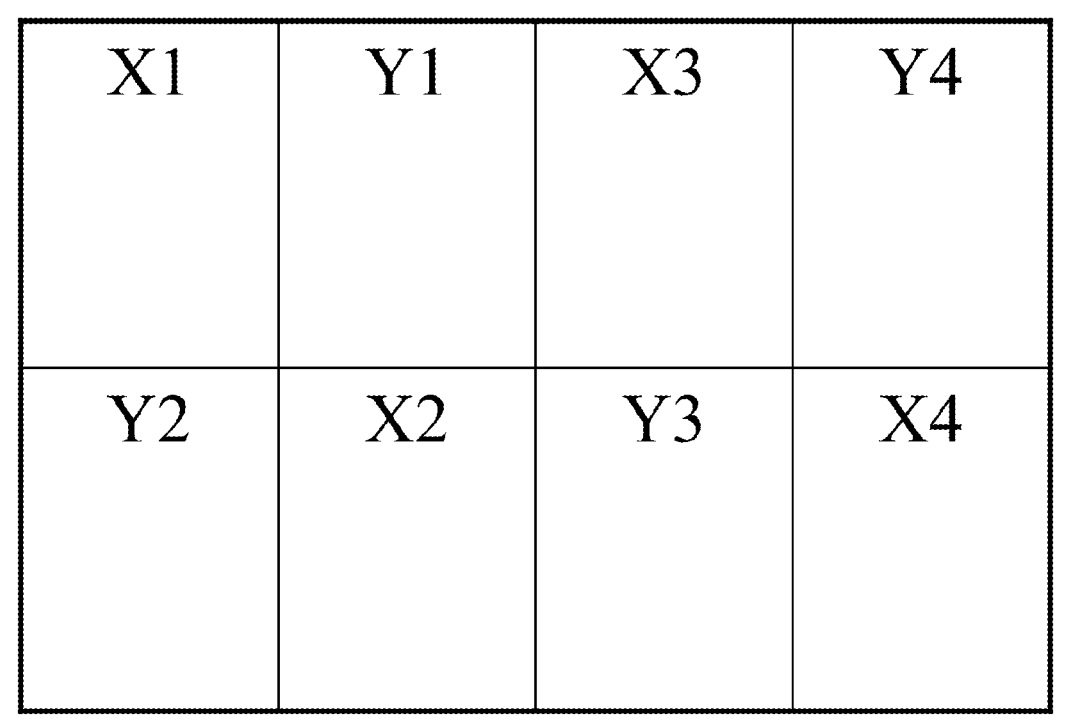
Figure 3B:
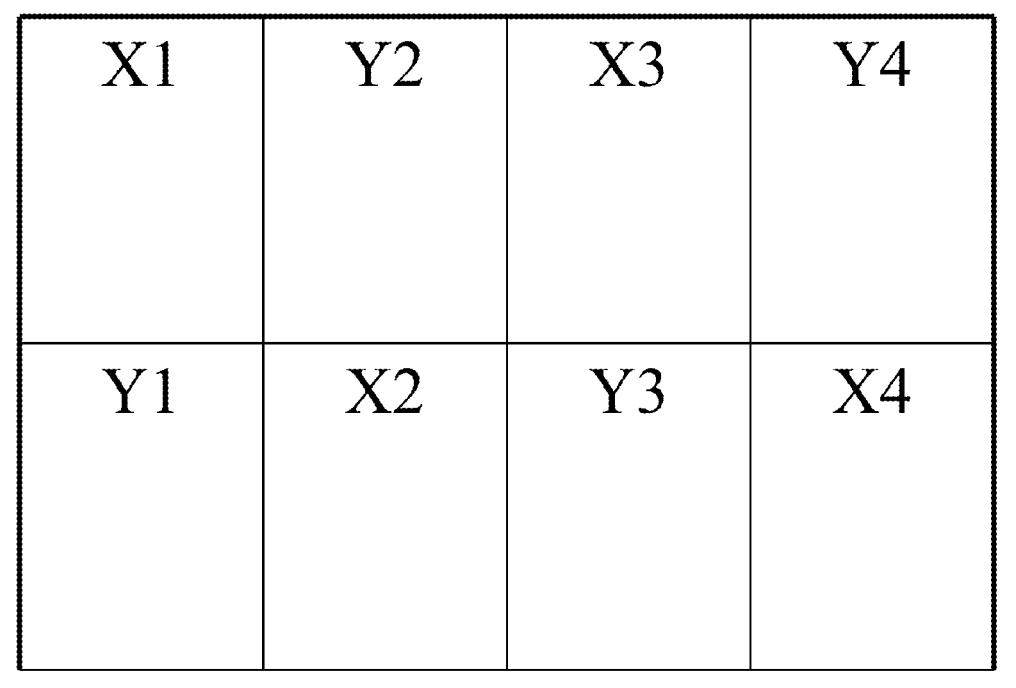

FIG. 3A and FIG. 3B illustrate examples of possible layouts of a four-cell metrology target according to an embodiment of the invention in which the targets are able to measure in both the x-direction and the y-direction. By interweaving the x and y cells one may reduce interference caused by the scatterometry technique employed to make these metrology measurements. When two x-cells, or two y-cells are positioned next to each other, cross-talk occurs, and so that the metrology measurements of each cell may be altered due to interference from the scattered radiation of its adjacent cell. By interweaving the x and y cells, cross-talk may be minimized, which allows for more accurate metrology measurements.

It is noted that the above-described examples illustrate application of an embodiment of the invention to critical dimension metrology, film metrology and overlay metrology. However, embodiments of the present invention are not limited in their application to just these types of metrology. By way of example, embodiments of the invention may also be extended to applications involving scanner dose and focus parameters should also be included by using known methods of model inversion e.g. polynomial and neural network, from other feature geometry parameters. It is anticipated that scanner focus may be a sensitive function of resist height as measured after exposure. However, resist height as measured on a grating cell may reasonably be expected to be a function not only of the lithographic conditions, but also of the initial resist thickness which may vary across the wafer. In order to improve the accuracy of an inversion model created on a focus exposure matrix, a two-cell target may be envisaged where one target (e.g., cell 1 106) enables a direct film measurement (e.g. a resist height since the cell is masked) and an adjacent cell (e.g., cell 2 107) is a grating cell where the resist height is measured after lithographic exposure. In this way the "resist height loss" resulting from exposure of the resist may be determined, which is expected to be a more sensitive parameter to focus than resist height alone which convolves information from the track, not just the scanner.

To determine the performance of feeding measurement information forward and/or sideways during semiconductor metrology, a measurement sequence was modeled experimentally using a simulation program. The simulation program used was a mix of two programs developed by KLA-Tencor. SpectraSuite 5.0 was used for generating diffraction database for a given sample producing Mueller Matrix elements for a given angle of illumination and ConfigutationAnalysisTool v10 was used to describe the optical system geometry and its illumination and collection characteristics including noise level producing an estimated uncertainty of the measurement based on selection of parameters of the sample used to perform the estimation.

Figure 4A:
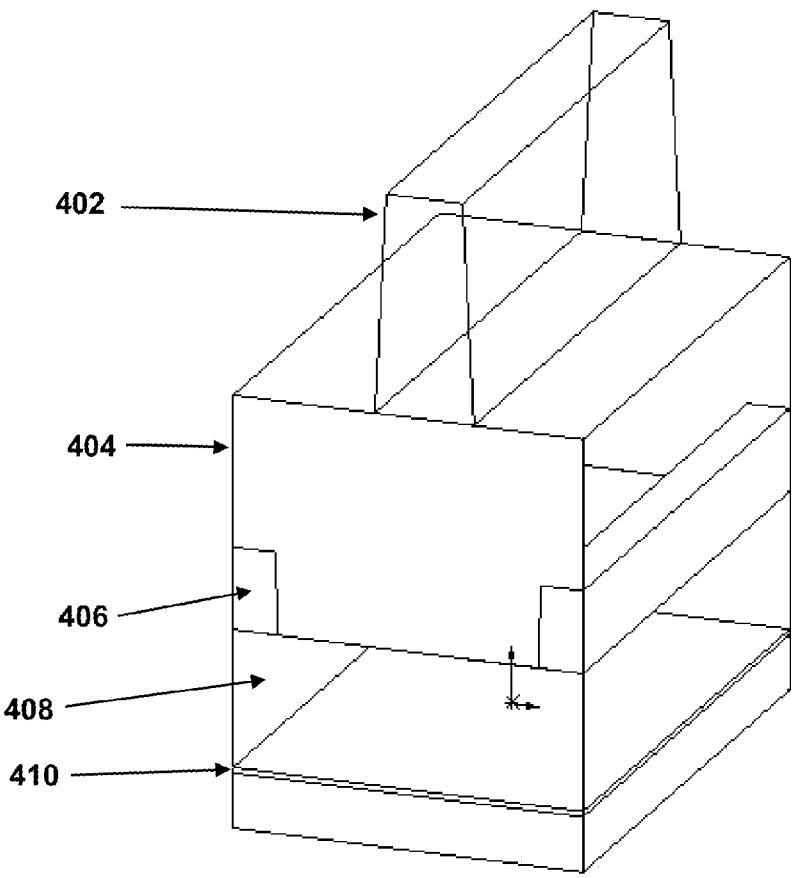
FIG. 4A is a three-dimensional diagram illustrating structure for which overlay metrology was simulated in accordance with an embodiment of the present invention.

The structure for which the measurement was simulated is illustrated in FIG. 4A. The structure corresponds to a resist grating on top of a hard-mask grating. A resist grating 402 is to be formed on top of a thin film material referred to as an ARC 404 which covers a hardmask grating 406 formed on a polysilicon layer 408 that lies on top of a gate oxide 410.

Figure 5A:
FIGS. 5A-5D are a sequence of cross-sectional schematic diagrams illustrating fabrication of structure for which metrology was simulated in accordance with an embodiment of the present invention.
Figure 5B:
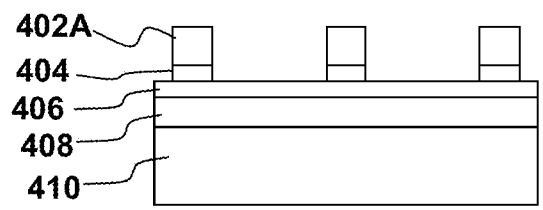
Figure 5C:
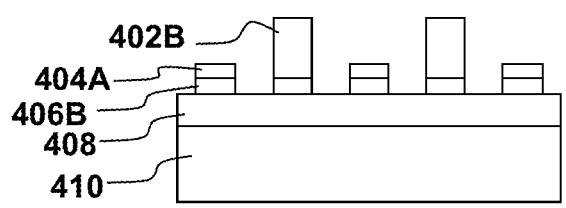
Figure 5D:
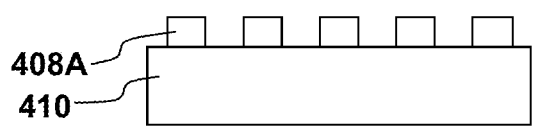
Figure 6A:
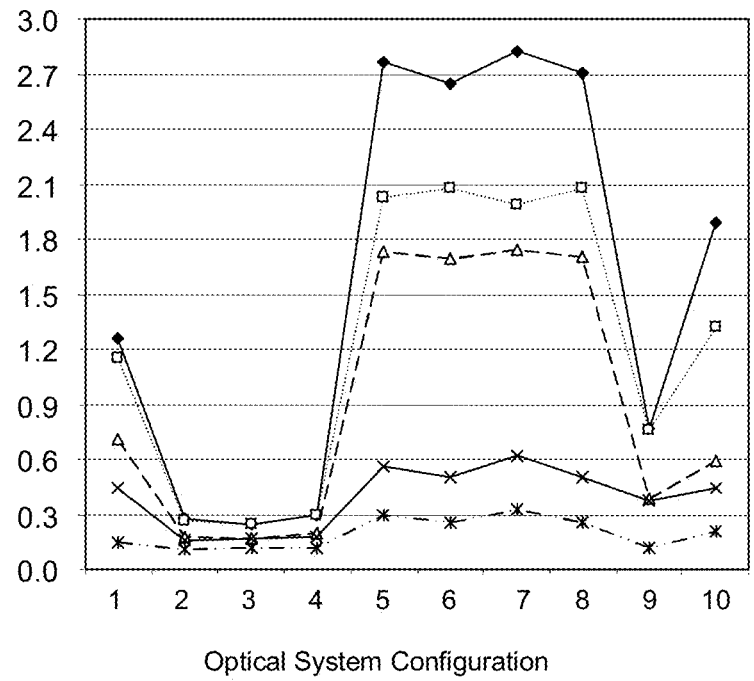
FIGS. 6A-6D are graphs showing the results of the metrology simulation for the fabrication sequence depicted in FIGS. 5A-5D.
Figure 6B:
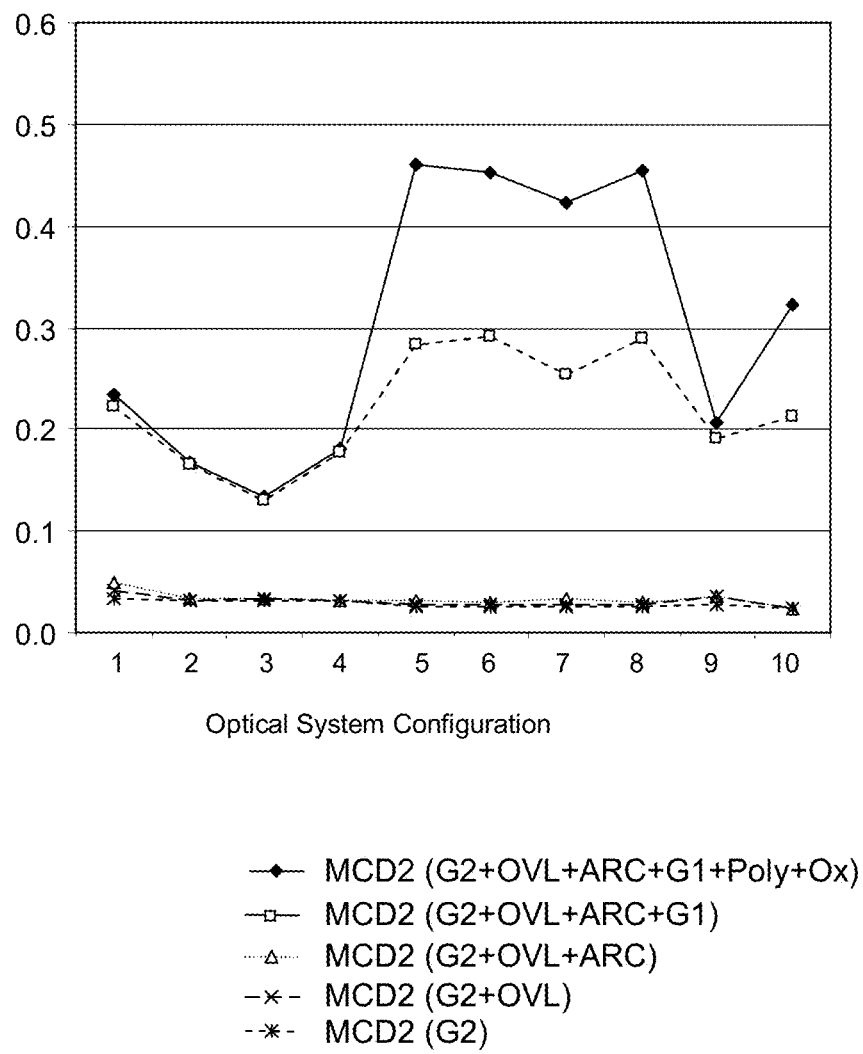
Figure 6C:
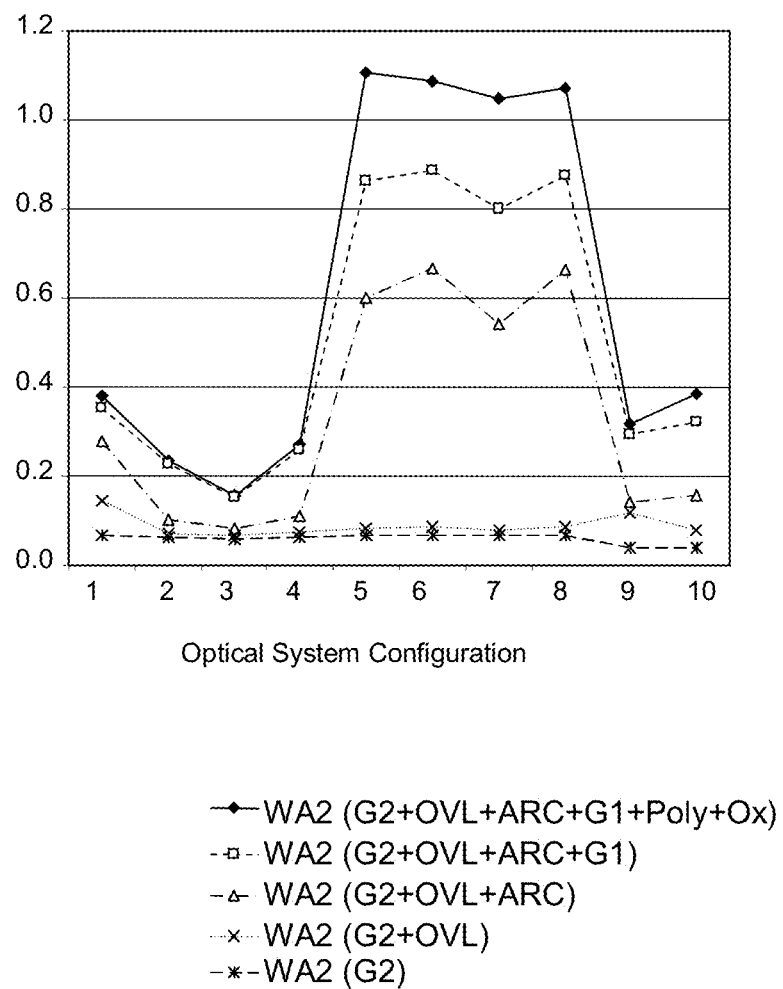
Figure 6D:
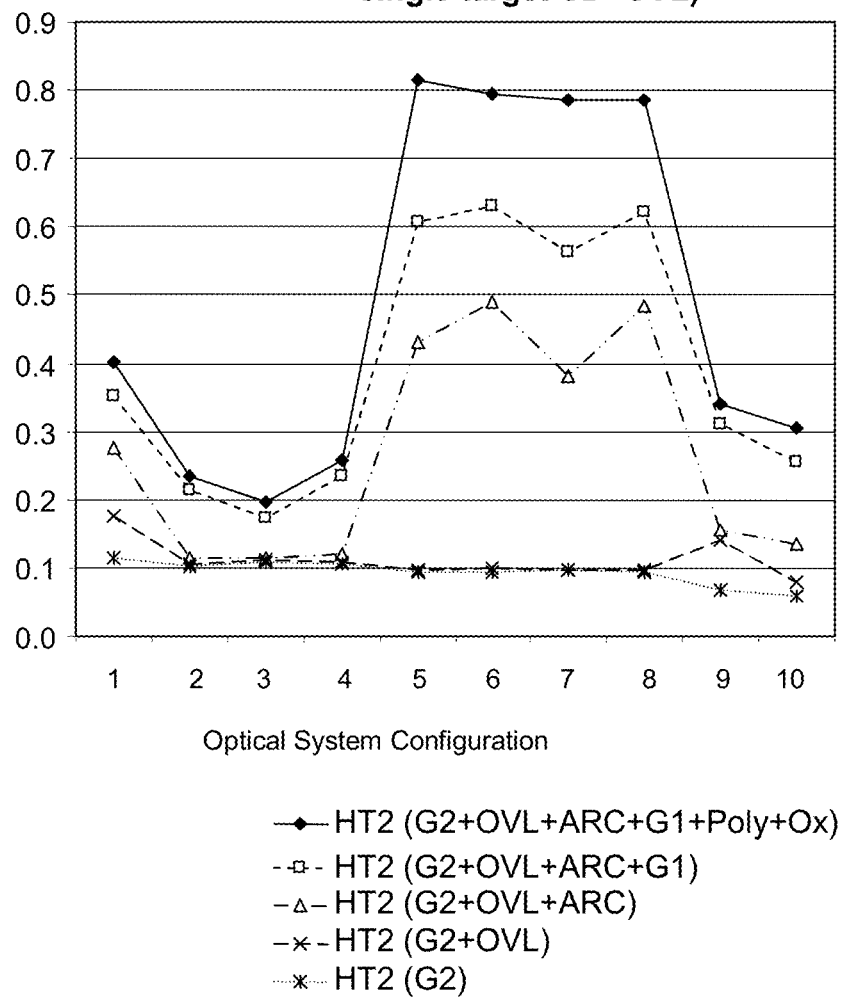

FIGS. 5A-5A depict the simulated fabrication sequence in used in conjunction with the simulations. As shown in FIG. 5A, a photomask mask 501 is used to pattern a first resist layer to form a top resist grating 402A on top of the thin film (ARC) layer 404 and hardmask layer 406. The geometry parameters of top resist grating 402A are collectively referred to herein as G2. The G2 geometry parameters include a critical dimension at a mid-point of the grating (MCD2), a side wall angle (SWA2), and a height (HT2). The thin film (ARC) layer 404 is etched through openings in the resist grating 402A down to the hardmask layer 406. After the first resist grating 402A is stripped, the pattern of the top resist grating has been transferred to the thin film material 404 forming a grating 404A. A second resist grating 402B is formed on exposed portions of the hardmask layer 406, as shown in FIG. 5B. A second photomask (not shown) is used to pattern a resist layer that forms the second resist grating 402B. The hardmask layer 406 is then etched through the patterned think film 404 and the second resist grating 402B down to the polysilicon layer 408 producing a bottom hardmask grating 406B as shown in FIG. 5C. The geometry parameters of the hard mask grating 406B are collectively referred to herein as G1. The G1 geometry parameters include a critical dimension at a mid-point of the grating (MCD1), a side wall angle (SWA1), and a height (HT1). The relative shift in the position of between top grating 402A and bottom grating 402B (or hardmask grating 406B) is referred to as overlay. Once the hardmask grating is formed, the polysilicon layer 408 may be etched through openings in the hardmask grating 406B thereby producing a polysilicon grating 408A on top of the gate oxide 410 as shown in FIG. 5D The results of the simulation are shown in FIGS. 6A-6D. The labels in the plots refer to the parameters of the simulation whose uncertainty of the measurement is being estimated. Thus for example, if a label states OVL, then only the overlay parameter was measured and only the overlay uncertainty was estimated. As an additional example, if a label states OVL(OVL+G2), then the overlay parameter and all the parameters of G2 (such as MCD2, SWA2, and HT2) were simulated as being measured and all their respective uncertainties were estimated so that in this case four parameters were simulated and four uncertainties were calculated, while only the overlay uncertainty is plotted.

The implicit information in each of the plots is that if a parameter is not being "measured" then it was provided into the measurement calculation by either feed-forward or feed-sideways from another measurement. Thus, the plots depict the improved precision for overlay measurement as more parameters are made available from either feed-forward or feed-sideways. The horizontal axis labels in FIGS. 6A-6D refer to the different KT reflectometer apparatus configurations that were simulated. These apparatus configurations are identified by numbers 1 through 10 along the horizontal axes of the graphs in FIGS. 6A-6D.

In the simulation results illustrated in FIGS. 6A-6D a 32 nm Gate ADI stack for Pattern-over-Pattern was analyzed to estimate expected precision (3 sigma) for a variety of hardware configurations. The feasibility of simultaneous OVL+CD target based measurements via scatterometry is demonstrated based on use of a Feed-Forward/Feed-Sideways strategy. As may be seen from FIGS. 6A-6D, for 235 nm lower wavelength based eUVR, the use of feed forward and feed sideways offers a significant advantage in the polarized mode. These results demonstrate the potential for a complete cascade design of single target multi-cell OVL+CD measurements.

Figure 4B:
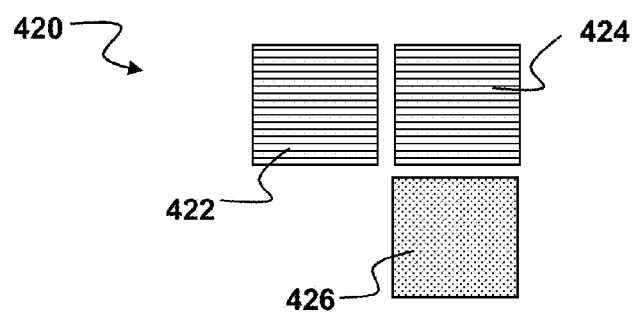
FIG. 4B is a plan view schematic diagram illustrating the layout of a three-cell metrology target that may be used for metrology on a structure of the type shown in FIG. 4A in accordance with an embodiment of the present invention.

It is noted that metrology may be performed on a structure of the type shown in FIG. 4A using a three-cell metrology target 420 as shown in FIG. 4B. Specifically, the metrology target 420 may include first and second cells 422, 424 having grating targets and a third cell 426 having a target designed to facilitate measurement of film thickness. Such a three-cell target 420 may be used to implement tough metrology cases by breaking down the metrology problem into pieces and feeding information forward and/or sideways to and from the different pieces. By way of example, the measurements of the first cell 422 may be used to for measurements that provide information used to determine the critical dimension and sidewall angle for portions of the hardmask grating 406. The second cell 424 may be used for measurements that provide information used to determine the critical dimension and sidewall angle for portions of resist grating 402. The third cell 426 may be used for measurements that provide information for determining a thickness of the polysilicon layer 408 before and after etching or other processes that may affect the thickness.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. In the claims that follow, the word "or" is to be interpreted as an inclusive "or"; e.g., A or B is satisfied if either A or B individually is present and alternatively satisfied if both A and B are present. The appended claims are not to be interpreted as including means-plus-function limitations, unless such a limitation is explicitly recited in a given claim using the phrase "means for."

What is claimed is:

1. A test structure for use in manufacturing a semiconductor device, comprising:
   a substrate;
   two or more test cells formed on the substrate or formed in a layer of material on a surface of the substrate, wherein each of said two or more test cells includes a plurality of test patterns formed on the substrate or formed on a layer of material formed thereon, wherein the two or more test cells include at least four cells, at least two of which have grating patterns that are oriented in a first direction and at least two others of which have grating patterns that are oriented in a second direction perpendicular to the first direction, wherein each of the at least two cells having grating patterns that are oriented in the first direction is positioned next to one of the at least two cells having grating patterns that are oriented in the second direction,
   wherein the test cells are configured for metrology measurements associated with two or more lithography steps performed on the substrate or one or more layers of material formed thereon, wherein for at least one lithography step at least two of said two or more test cells are patterned with the same test pattern, wherein for at least one other lithography step only one of said two or more test cells is patterned and another of said two or more test cells is left unpatterned, wherein test patterns in each of said two or more test cells are configured to facilitate feed forward and feed sideways of metrology information.

2. The test structure of claim 1 wherein the patterns in each cell and/or the differences in the patterns between cells are configured or to reduce the number of fitted parameters in a metrology measurement.

3. The test structure of claim 1, wherein said two or more test cells comprise at least three cells, at least one of which includes an imaging target.

4. The test structure of claim 1, wherein said two or more test cells comprise three cells, including first and second cells containing grating targets and a third cell containing a film thickness target.

5. The test structure of claim 1, wherein the metrology measurements obtained using said two or more test cells include film metrology information, critical dimension information, overlay information, scanner dose, focus parameters, and/or resist height.

6. The test structure of claim 1, wherein differences in the patterns between two or more of said two or more test cells are configured to facilitate feed forward and feed sideways of metrology information.

7. The test structure of claim 3, wherein the image target includes a first structure in a first layer and a second structure formed in a second layer, and wherein the first structure and the second structure are periodic structures.

* * * * *